(12) United States Patent
Watanabe et al.

(10) Patent No.: US 9,324,908 B2
(45) Date of Patent: Apr. 26, 2016

(54) NITRIDE SEMICONDUCTOR LIGHT-EMITTING ELEMENT

(71) Applicant: Sharp Kabushiki Kaisha, Osaka-shi (JP)

(72) Inventors: Masanori Watanabe, Osaka (JP); Satoshi Komada, Osaka (JP); Tomoya Inoue, Osaka (JP); Kosuke Kawabata, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 0 days.

(21) Appl. No.: 14/653,703

(22) PCT Filed: Mar. 28, 2014

(86) PCT No.: PCT/JP2014/059122
§ 371 (c)(1),
(2) Date: Jun. 18, 2015

(87) PCT Pub. No.: WO2014/178248
PCT Pub. Date: Nov. 6, 2014

(65) Prior Publication Data
US 2015/0349197 A1 Dec. 3, 2015

(30) Foreign Application Priority Data

Apr. 30, 2013 (JP) .................................. 2013-095469

(51) Int. Cl.
*H01L 31/0328* (2006.01)
*H01L 27/15* (2006.01)
(Continued)

(52) U.S. Cl.
CPC ............ *H01L 33/06* (2013.01); *H01L 33/0025* (2013.01); *H01L 33/025* (2013.01); *H01L 33/32* (2013.01); *H01L 33/12* (2013.01); *H01L 33/20* (2013.01)

(58) Field of Classification Search
CPC ..................... H01L 21/0254; H01L 21/02458; H01L 33/08; H01L 33/007; H01L 33/0075; H01L 33/285; H01L 33/30; H01L 33/343; H01L 29/2003; H01L 29/452
USPC ........................ 257/13, 79, 80, 86, 184, 189
See application file for complete search history.

(56) References Cited

U.S. PATENT DOCUMENTS

| 7,193,246 B1 | 3/2007 | Tanizawa et al. |
| 8,816,321 B2 * | 8/2014 | Takeoka ............... H01L 33/025 257/11 |

(Continued)

FOREIGN PATENT DOCUMENTS

| JP | 9-153645 | 6/1997 |
| JP | 10-173231 | 6/1998 |

(Continued)

OTHER PUBLICATIONS

International Search Report mailed Jun. 17, 2014, directed to International Application No. PCT/JP2014/059122; 2 pages.

*Primary Examiner* — Hsien Ming Lee
(74) *Attorney, Agent, or Firm* — Morrison & Foerster LLP

(57) ABSTRACT

Provided is a nitride semiconductor light-emitting element including in order a first n-type nitride semiconductor layer, a second n-type nitride semiconductor layer, an n-type electron-injection layer, a light-emitting layer, and a p-type nitride semiconductor layer, wherein the average n-type dopant concentration of the second n-type nitride semiconductor layer is 0.53 times or less as high as the average n-type dopant concentration of the first n-type nitride semiconductor layer, and the average n-type dopant concentration of the n-type electron-injection layer is 1.5 times or more as high as the average n-type dopant concentration of the second n-type nitride semiconductor layer.

4 Claims, 8 Drawing Sheets

(51) Int. Cl.
*H01L 31/0336* (2006.01)
*H01L 21/00* (2006.01)
*H01L 33/06* (2010.01)
*H01L 33/00* (2010.01)
*H01L 33/32* (2010.01)
*H01L 33/02* (2010.01)
*H01L 33/20* (2010.01)
*H01L 33/12* (2010.01)

(56) References Cited

U.S. PATENT DOCUMENTS

| | | |
|---|---|---|
| 2002/0171092 A1 | 11/2002 | Goetz et al. |
| 2005/0151154 A1 | 7/2005 | Akita et al. |
| 2005/0205881 A1 | 9/2005 | Yamazoe et al. |
| 2007/0063207 A1 | 3/2007 | Tanizawa et al. |
| 2007/0202621 A1 | 8/2007 | Komada et al. |
| 2008/0076199 A1 | 3/2008 | Akita et al. |
| 2008/0191195 A1 | 8/2008 | Tanizawa et al. |
| 2012/0001223 A1* | 1/2012 | Inoue .................... H01L 33/14 257/103 |

FOREIGN PATENT DOCUMENTS

| | | |
|---|---|---|
| JP | 2000-232237 | 8/2000 |
| JP | 2002-299685 | 10/2002 |
| JP | 2004-343147 | 12/2004 |
| JP | 2005-203520 | 7/2005 |
| JP | 2005-260215 | 9/2005 |
| JP | 2006-120856 | 5/2006 |
| JP | 2007-234648 | 9/2007 |

* cited by examiner

NITRIDE SEMICONDUCTOR LIGHT-EMITTING ELEMENT

CROSS REFERENCE TO RELATED APPLICATIONS

This application is a U.S. National Phase patent application of PCT/JP2014/059122, filed on Mar. 28, 2014, which claims priority to Japanese Application No. 2013-095469, filed on Apr. 30, 2013, each of which is hereby incorporated by reference in the present disclosure in its entirety.

FIELD OF THE INVENTION

The present invention relates to a nitride semiconductor light-emitting element.

BACKGROUND OF THE INVENTION

A group III-V compound semiconductor material containing nitrogen (hereinafter referred to as "nitride semiconductor material") has a band gap equivalent to the energy of light having a wavelength from the infrared region to the ultraviolet region. Therefore, the nitride semiconductor material is useful as a material for a light-emitting element that emits light having a wavelength from the infrared region to the ultraviolet region or as a material for a light-receiving element that receives light having a wavelength in the same region, for example.

Further, the nitride semiconductor material possesses a strong interatomic bonding force, a high dielectric breakdown voltage and a large saturated electron velocity. Therefore, the nitride semiconductor material is also useful as a material for an electronic device such as a high-frequency transistor which is resistant to high temperatures and has a high output power. Furthermore, since the nitride semiconductor material almost does no harm to the environment, and thereby it is gaining attention as an easy-to-handle material.

In an nitride semiconductor light-emitting element made of the nitride semiconductor material having the above characteristics, it is common to employ a quantum well structure in a light-emitting layer. When a voltage is applied to the nitride semiconductor light-emitting element employing the quantum well structure in the light-emitting layer, electrons and holes in the quantum well structure of the light-emitting layer are recombined to generate light. As the light-emitting layer having a quantum well structure, it is acceptable to adopt a single quantum well (SQW) structure, but in most cases, a multiple quantum well (MQW) structure in which quantum well layers and barrier layers are stacked alternately is used instead.

Generally, a quantum well layer of a light-emitting layer is made of InGaN, and a barrier layer thereof is made of GaN. Thus, it is possible to fabricate a blue LED (Light-Emitting Device) having an emission peak wavelength of about 450 nm, and it is also possible to fabricate a white LED in combination with a yellow phosphor. In the case where the barrier layer is made of AlGaN, it is believed that the luminous efficiency may be improved due to the increase on the difference of band gap energy between the quantum well layer and the barrier layer, but it is accompanied by such a problem that it is harder to obtain crystals of good quality from AlGaN than GaN.

Generally, an n-type nitride semiconductor layer is made of GaN or InGaN.

For example, Japanese Patent Laying-Open No. 2004-343147 (PTD 1) discloses an LED element having a structure where an n-side multi-layered film layer which includes a nitride semiconductor layer containing In is disposed below an active layer. According to the LED element described in PTD 1, it is inferred that the n-side multi-layered film layer disposed below the active layer functions to improve the output of the light-emitting element by improving the crystallinity of the active layer.

Japanese Patent Laying-Open No. 2002-299685 (PTD 2) discloses a group III nitride LED in which a spacer layer and an active region are deposited in order on a smoothing layer doped with Si in the range of $2\times10^{17}$ cm$^{-3}$ to $2\times10^{19}$ cm$^3$, and the smoothing layer is doped much heavily than the spacer layer. In the group III nitride LED of PTD 2, the smoothing layer has a function of restoring a flat two-dimensional growth of the group III nitride semiconductor layer at a low temperature, and thereby, both the efficiency and the reliability of the group III nitride LED can be improved.

Japanese Patent Laying-Open No. 2005-203520 (PTD 3) discloses a light-emitting diode which is provided with a buffer layer made of Si-doped GaN semiconductor, a third AlGaN semiconductor layer 9 made of Si-doped $Al_{0.18}Ga_{0.82}N$ semiconductor and a light-emitting region composed of well layers 35a to 35c and barrier layers 37a to 37d both made of InAlGaN semiconductors on a supporting substrate composed of a GaN substrate, and emits light having a peak wavelength of 359 nm.

Japanese Patent Laying-Open No. 9-153645 JP (PTD 4) discloses a light-emitting diode which includes by stacking a high carrier concentration n+ layer having a film thickness of about 2.0 μm and made of silicon-doped GaN having an electron concentration of $2\times10^{18}$/cm$^3$, an n layer having a film thickness of about 1.0 μm thickness and made of silicon-doped $Al_{0.3}Ga_{0.7}N$ having an electron concentration of $2\times10^{18}$/cm$^3$, a light-emitting layer having a total film thickness of about 0.11 μm, a p layer having a film thickness of about 1.0 μm and made of $Al_{0.3}Ga_{0.7}N$ doped with magnesium having a hole concentration of $5\times10^{17}$/cm$^3$ and a magnesium concentration of $1\times10^{20}$/cm$^3$, and a contact layer having a film thickness of about 0.2 μm and made of GaN doped with magnesium having a hole concentration of $7\times10^{17}$/cm$^3$ and a magnesium concentration of $2\times10^{20}$/cm$^3$ on an AlN buffer layer, and has a light-emitting peak wavelength of 380 nm.

Japanese Patent Laying-Open No. 10-173231 (PTD 5) discloses a light-emitting element structured to have a Si-doped layer n+GaN with a carrier concentration of $1\times10^{18}$/cm$^3$ and an n-type $In_{0.15}Ga_{0.85}N$ layer grown in order on a Si-doped n+GaN layer with a carrier concentration of $1\times10^{19}$/cm$^3$. In the light-emitting element described in PTD 5, a current flows uniformly in the entire active layer, and thereby, uniform light emission can be obtained.

PTD 1: Japanese Patent Laying-Open No. 2004-343147
PTD 2: Japanese Patent Laying-Open No. 2002-299685
PTD 3: Japanese Patent Laying-Open No. 2005-203520
PTD 4: Japanese Patent Laying-Open No. 9-153645
PTD 5: Japanese Patent Laying-Open No. 10-173231

SUMMARY OF THE INVENTION

In the case of using AlGaN or InGaAlN having a larger band gap than GaN as a barrier layer in the light-emitting layer having a multiple quantum well structure, when the n-side layer is InGaN or GaN, the overflow of holes from the light-emitting layer into the n-side layer is prone to occur, and as a result, particularly in the case where an operating current density is set high, the current-luminous efficiency (W/A) which is a ratio of a light emission amount relative to an input current to the nitride semiconductor light-emitting element, and the power-luminous efficiency (W/W) which is a ratio of a light emission amount relative to an input power will decrease disadvantageously.

An object of the present invention is to provide a nitride semiconductor light-emitting element capable of improving the luminous efficiency even in the case where an operating current density is high.

The present invention provides a nitride semiconductor light-emitting element which includes in order a first n-type nitride semiconductor layer, a second n-type nitride semiconductor layer, an n-type electron-injection layer, a light-emitting layer, and a p-type nitride semiconductor layer, wherein the average n-type dopant concentration of the second n-type nitride semiconductor layer is 0.53 times or less as high as the average n-type dopant concentration of the first n-type nitride semiconductor layer, and the average n-type dopant concentration of the n-type electron-injection layer is 1.5 times or more as high as the average n-type dopant concentration of the second n-type nitride semiconductor layer. After intensive investigations by the inventors of the present invention, they found that by adopting the configuration described above, it is possible to improve the luminous efficiency of the nitride semiconductor light-emitting element even in the case where the operating current density is high.

According to the present invention, it is possible to provide a nitride semiconductor light-emitting element capable of improving the luminous efficiency even in the case where the operating current density is high.

DETAILED DESCRIPTION OF THE INVENTION

Figure 1:
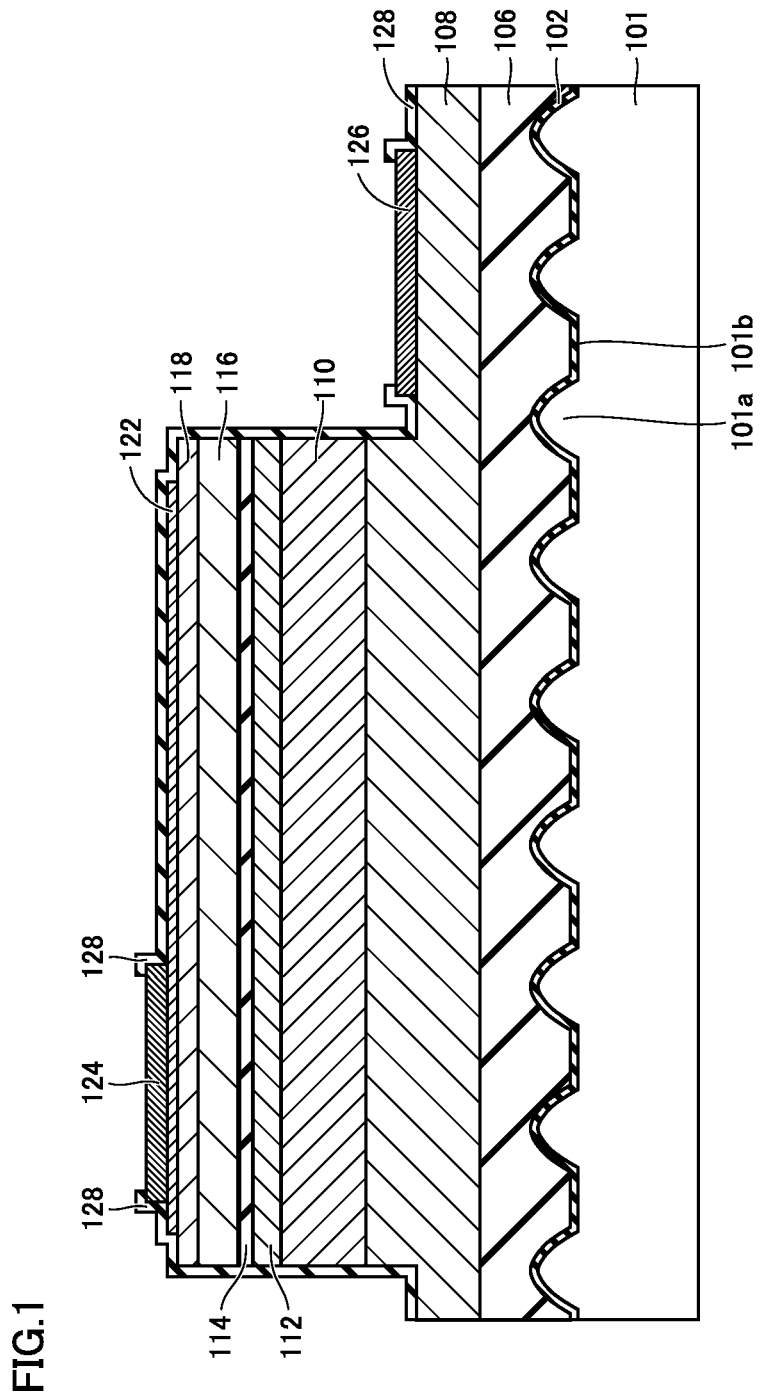
FIG. 1 is a schematic sectional view of a nitride semiconductor light-emitting element according to an embodiment.

Embodiments of the present invention will be described hereinafter. In the drawings of the present invention, the same reference numeral designates the same portion or a corresponding portion.

In the present specification, a "barrier layer" means a layer sandwiched between quantum well layers. A barrier layer which is not sandwiched by the quantum well layers is referred to as a "first barrier layer" or a "last barrier layer" and is designated differently from the layer sandwiched between quantum well layers.

In the present specification, the term of "dopant concentration" and the term of "carrier concentration" representing the concentration of electrons and holes generated when doped by an n-type or a p-type dopant are used, and the relationship therebetween will be described later.

In present specification, a "carrier gas" means any gas other than a group III source gas, a group V source gas and a dopant source gas, and atoms of a carrier gas will not be incorporated into a nitride semiconductor layer or the like.

In present specification, the wording of "undoped" means that the doping is not performed intentionally, and thereby an undoped layer may include dopants due to the diffusion of dopants from an adjacent layer.

In the present specification, an "n-type nitride semiconductor layer" may include an n-type layer or an undoped layer having a low carrier concentration and a thickness not practically hindering the flow of electrons therein. The wording of "not practically hindering" means that an operating voltage of a nitride semiconductor light-emitting element is at a practical level.

In the present specification, a "p-side nitride semiconductor layer" may include a p-type layer or an undoped layer having a low carrier concentration and a thickness not practically hindering the flow of holes. The wording of "not practically hindering" means that an operating voltage of a nitride semiconductor light-emitting element is at a practical level.

In present specification, the notation of "AlGaN" means that a substance includes Al, Ga and N as atoms, and the composition thereof is not particularly limited. The same is true for InGaN, AlGaInN and AlON.

In the present specification, a "nitride semiconductor" ideally possesses an atomic ratio of 1:1 between nitrogen (N) and the other elements (Al, Ga, In), but due to the reasons that a dopant may be contained therein or an actually formed substance may not be necessarily perfect, the atomic ratio may deviate from 1:1. In the present specification, when a nitride semiconductor is denoted as $Al_xGa_{1-x}N$, the atomic ratio between nitrogen (N) and the other elements (Al, Ga) is not intentionally limited to completely comply with the ration of 1:1. The deviation from the atomic ratio of 1:1 will be ignored in the descriptions of the present specification.

In the present specification, the relationship between a band gap Eg (eV) of a nitride semiconductor and a crystal mixing ratio x of Al or In is determined by using the following equations (I) and (II) described by Joachim Piprek in "Semiconductor Optoelectric Devices", Academic Press, 2003, page 191.

$$Eg(In_xGa_{1-x}N)=1.89x+3.42(1-x)-3.8x(1-x) \quad (I)$$

$$Eg(Al_xGa_{1-x}N)=6.28x+3.42(1-x)-1.3x(1-x) \quad (II)$$

Figure 2:
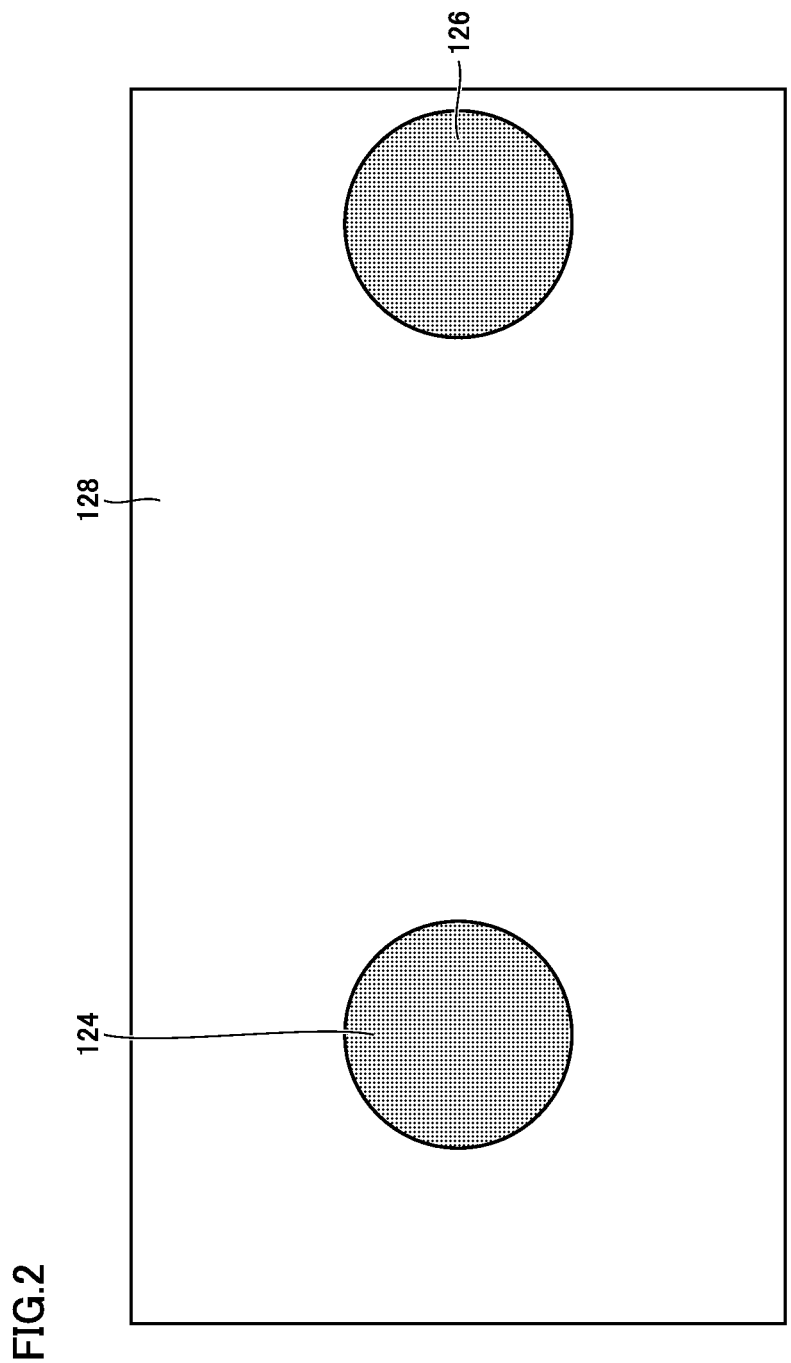
FIG. 2 is a schematic plan view from the top of the nitride semiconductor light-emitting element according to an embodiment.

FIG. 1 is a schematic sectional view of a nitride semiconductor light-emitting element according to an embodiment which serves as an example of a nitride semiconductor light-emitting element of the present invention, and FIG. 2 is a schematic plan view from the top of the nitride semiconductor light-emitting element according to the embodiment.

The nitride semiconductor light-emitting element of the embodiment includes a substrate 101, and sequentially provided on substrate 101, a buffer layer 102, a nitride semiconductor base layer 106, a first n-type nitride semiconductor layer 108, a second n-type nitride semiconductor layer 110, an n-type electron-injection layer 112, a light-emitting layer 114, a p-type nitride semiconductor layer 116 and a p-type nitride semiconductor layer 118.

A transparent electrode layer 122 is provided on p-type nitride semiconductor layer 118, and a p electrode 124 is provided on transparent electrode layer 122. An n electrode 126 is provided on first n-type nitride semiconductor layer 108. In order to expose a portion of the surface of n electrode 126 and a portion of the surface of p electrode 124, the surface of the nitride semiconductor light-emitting element is covered with a transparent insulation protection film 128.

Substrate 101 may be any substrate made of, for example, sapphire, GaN, SiC, Si, or ZnO. Though the thickness of substrate 101 is not particularly limited, it is preferable that the thickness of substrate 101 during the growth of a nitride semiconductor layer is 900 µm or more and 1200 µm or less, and the thickness of substrate 101 during the use of the nitride semiconductor light-emitting element is 50 µm or more and 300 µm or less.

A top surface of substrate 101 may be formed into a convex-concave shape composed of convex portions 101a and concave portions 101b, or the top surface may be flat. Though the shape of convex portion 101a and concave portion 101b on the top surface of substrate 101 is not particularly limited, it is preferable that convex portion 101a has a substantially circular shape arranged at a vertex of a substantially equilateral triangle in planar view and the distance between the vertexes of adjacent convex portions 101a is 1 µm or more and 5 µm or less. The cross-sectional shape of convex portion 101a may be a trapezoidal shape, and in this case, the top portion of the trapezoidal shape is preferably rounded.

Note that since substrate 101 will be removed after the growth of a nitride semiconductor layer on substrate 101, the nitride semiconductor light-emitting element of the present invention may be a nitride semiconductor light-emitting element without including substrate 101.

Buffer layer 102 may be, for example, an AlON layer (the ratio of atoms O relative to atoms N is less than 10 atom %) or a nitride semiconductor layer represented by the formula of $Al_{s0}Ga_{t0}O_{u0}N_{1-u0}$ ($0 \leq s0 \leq 1$, $0 \leq t0 \leq 1$, $0 \leq u0 \leq 1$, $s0+t0 \neq 0$).

Here, as the AlON layer constituting buffer layer 102, it is preferable that a small amount (0.5 atom % or more and 2 atom % or less) of atoms N is replaced by oxygen atoms. In this case, since buffer layer 102 is formed to extend in the direction normal to the growth surface of substrate 101, it is possible to obtain buffer layer 102 made of an aggregate of columnar crystals with uniform crystal grains.

The thickness of buffer layer 102 is not particularly limited but is preferably 3 nm or more and 100 nm or less and more preferably 5 nm or more and 50 nm or less.

In order to improve the half-width of X-ray rocking curve of nitride semiconductor base layer 106, it is preferable to adopt an AlON layer formed by a publicly-known sputtering method as buffer layer 102.

In addition, buffer layer 102 may be, for example, a GaN layer grown by the MOCVD method at a low temperature of about 500° C.

Nitride semiconductor base layer 106 may be, for example, a layer made of a group III nitride semiconductor represented by the formula of $Al_{x0}Ga_{y0}In_{z0}N$ ($0 \leq x0 \leq 1$, $0 \leq y0 \leq 1$, $0 \leq z0 \leq 1$, $x0+y0+z0 \neq 0$).

Each nitride semiconductor layer to be described hereinafter, including nitride semiconductor base layer 106, may be formed by for example the MOCVD (Metal Organic Chemical Vapor Deposition) method but not limited thereto, and it may be formed by an MBE (Molecular Beam Epitaxy) method or a VPE (Vapor Phase Epitaxy) method, for example.

In order to avoid the transition of crystal defects such as dislocations in buffer layer 102 composed of an aggregate of columnar crystals, it is preferable that nitride semiconductor base layer 106 is a nitride semiconductor layer containing Ga as a group III element.

Nitride semiconductor base layer 106 may be an undoped layer or may be doped with for example an n-type dopant in the range of $1 \times 10^{16}/cm^3$ or more and $1 \times 10^{20}/cm^3$ or less. The n-type dopant may be, for example, at least one selected from the group consisting of Si, Ge and Sn, and among them, Si is preferable. In the case where the n-type dopant is Si, it is preferable to use silane or disilane as a n-type doping gas. The same applies to each of the n-type doped nitride semiconductor layers which will be described later.

The temperature of substrate 101 during the growth of nitride semiconductor base layer 106 is preferably 800° C. or more and 1250° C. or less, and more preferably 900° C. or more and 1150° C. or less. If the temperature of substrate 101 during the growth of nitride semiconductor base layer 106 is 800° C. or more and 1250° C. or less and particularly 900° C. or more and 1150° C. or less, it is possible to grow nitride semiconductor base layer 106 having excellent crystallinity with less crystal defects.

Increasing the thickness of nitride semiconductor base layer 106 as much as possible may help to reduce crystal defects in nitride semiconductor base layer 106, but it will bring about such a problem that the warpage of a wafer (which is formed with nitride semiconductor layers disposed on the substrate) will increase due to thermal expansion coefficient difference between the wafer and the substrate, and the defect reduction effect in nitride semiconductor base layer 106 will saturate after the thickness of nitride semiconductor base layer 106 reaches a certain thickness. Thus, the thickness of nitride semiconductor base layer 106 is preferably 1 µm or more and 8 µm or less, and more preferably 3 µm or more and 5 µm or less.

First n-type nitride semiconductor layer 108 may be, for example, a layer made of a group III nitride semiconductor represented by the formula of $Al_{x1}Ga_{y1}In_{z1}N$ ($0 \leq x1 \leq 1$, $0 \leq y1 \leq 1$, $0 \leq z1 \leq 1$, $x1+y1+z1 \neq 0$) and doped with an n-type dopant, and preferably a layer of $Al_{x1}Ga_{1-x1}N$ ($0 \leq x1 \leq 1$, preferably $0 \leq x1 \leq 0.5$, and more preferably $0 \leq x1 \leq 0.1$) doped with an n-type dopant.

From the viewpoint of increasing the luminous efficiency of the nitride semiconductor light-emitting element even though the operating current density is high, the n-type dopant concentration of first n-type nitride semiconductor layer 108 is preferably $2 \times 10^{18}/cm^3$ or more. From the viewpoint of increasing the luminous efficiency of the nitride semiconductor light-emitting element even though the operating current density is high, the n-type dopant concentration of first n-type nitride semiconductor layer 108 is preferably $5 \times 10^{19}/cm^3$ or less.

The thicker the thickness of first n-type nitride semiconductor layer 108 is, the smaller the resistance of first n-type nitride semiconductor layer 108 will be. However, increasing the thickness of first n-type nitride semiconductor layer 108 will increase the manufacturing cost of the nitride semiconductor light-emitting element. To balance the both, the thickness of first n-type nitride semiconductor layer 108 is preferably 1 µm or more and 10 µm or less but not limited thereto.

First n-type nitride semiconductor layer 108 may be a single layer or may be a composite layer composed of two or more layers different in composition or the doping concentration or both. In the case where first n-type nitride semiconductor layer 108 is a composite layer, each layer may have the same composition or at least one layer may have a different composition. In the case where first n-type nitride semiconductor layer 108 is a composite layer, each layer may have the same thickness or at least one layer may have a different thickness.

As to be described in the following examples, first n-type nitride semiconductor layer 108 may be formed by two growth steps including a step of firstly growing an n-type nitride semiconductor layer which is an n-type GaN layer in a growth furnace and a step of removing it from the growth furnace and growing another n-type nitride semiconductor layer which is also an n-type GaN layer in another growth furnace. However, the structure of first n-type nitride semiconductor layer 108 is not particularly limited.

Since first n-type nitride semiconductor layer 108 also serves as a contact layer of the n electrode to be described below, it is preferable that at least a part thereof which serves as the contact layer of n electrode 126 has a high doping concentration of $1 \times 10^{18}/cm^3$ or more.

Second n-type nitride semiconductor layer 110 may be, for example, a layer made of a group III nitride semiconductor represented by the formula of $Al_{x2}Ga_{y2}In_{z2}N$ ($0 \leq x2 \leq 1$, $0 \leq y2 \leq 1$, $0 \leq z2 \leq 1$, $x2+y2+z2 \neq 0$) and doped with an n-type dopant, and preferably a layer of $Al_{x2}Ga_{1-x2}N$ ($0 \leq x2 \leq 1$, preferably $0 \leq x2 \leq 0.3$, and more preferably $0 \leq x2 \leq 0.1$) or a layer of $In_{z2}Ga_{1-z2}N$ ($0 \leq z2 \leq 1$, preferably $0 \leq z2 \leq 0.3$, and more preferably $0 \leq z2 \leq 0.1$) doped with an n-type dopant.

The average n-type dopant concentration of second n-type nitride semiconductor layer 110 is 0.53 times or less and preferable 0.5 times or less as high as the average n-type dopant concentration of first n-type nitride semiconductor layer 108.

The thickness of second n-type nitride semiconductor layer 110 is not particularly limited, but is preferably 50 nm or more and 500 nm or less.

Second n-type nitride semiconductor layer 110 may be a single layer or may be a composite layer composed of two or more layers different in composition or the doping concentration or both. In the case where second n-type nitride semiconductor layer 110 is a composite layer, each layer may have the same composition or at least one layer may have a different composition. In the case where second n-type nitride semiconductor layer 110 is a composite layer, each layer may have the same thickness or at least one layer may have a different thickness.

In addition, it is acceptable to use an undoped nitride semiconductor layer to replace second n-type nitride semiconductor layer 110, undoped nitride semiconductor layer being prepared in the same manner as second n-type nitride semiconductor layer 110 except that the layer is undoped with an n-type dopant.

N-type electron-injection layer 112 may be, for example, a layer made of a group III nitride semiconductor represented by the formula of $Al_{x3}Ga_{y3}In_{z3}N$ ($0 \leq x3 \leq 1$, $0 \leq y3 \leq 1$, $0 \leq z3 \leq 1$, $x3+y3+z3 \neq 0$) and doped with an n-type dopant. It is preferable that n-type electron-injection layer 112 has a larger band gap than second n-type nitride semiconductor layer 110. Among them, it is preferable that n-type electron-injection layer is a layer made of nitride semiconductor containing Ga and Al and doped with an n-type dopant. In the case where n-type electron-injection layer 112 is made of $Al_{x3}Ga_{y3}In_{z3}N$ having a larger band gap than second n-type nitride semiconductor layer 110, from the viewpoint of perfectly injecting electrons to light-emitting layer 114, the composition ratio x3 of Al is preferably greater than x2 in the range of 0.01 or more and 0.1 or less, and more preferably greater than x2 in the range of 0.05 or less.

The n-type dopant concentration of n-type electron-injection layer 112 is 1.5 times or more, preferably two times or more as high as the n-type dopant concentration of second n-type nitride semiconductor layer 110. In the case where second n-type nitride semiconductor layer 110 is a composite layer, the average n-type dopant concentration of n-type electron-injection layer 112 is 1.5 times or more, preferably two times or more as high as the average n-type dopant concentration of second n-type nitride semiconductor layer 110.

N-type electron-injection layer 112 may be a single layer or may be a composite layer composed of multiple layers different in composition and/or dopant concentration. For example, considering the diffusion of dopant during manufacturing, n-type electron-injection layer 112 of about 5 nm in thickness adjacent to light-emitting layer 114 may be manufactured without being intentionally doped.

The thickness of n-type electron-injection layer 112 is preferably 10 nm or more and 100 nm or less. If the thickness of n-type electron-injection layer 112 is 10 nm or more, the n-type electron-injection layer function of n-type electron-injection layer 112 is prone to be improved, and if the thickness of n-type electron-injection layer 112 is 100 nm or less, it is difficult for a depletion layer to spread in second n-type nitride semiconductor layer 110, making it possible to reduce an electrostatic withstand voltage.

Note that n-type electron-injection layer 112 also functions as an n-type cladding layer sandwiching light-emitting layer 114.

Figure 3:
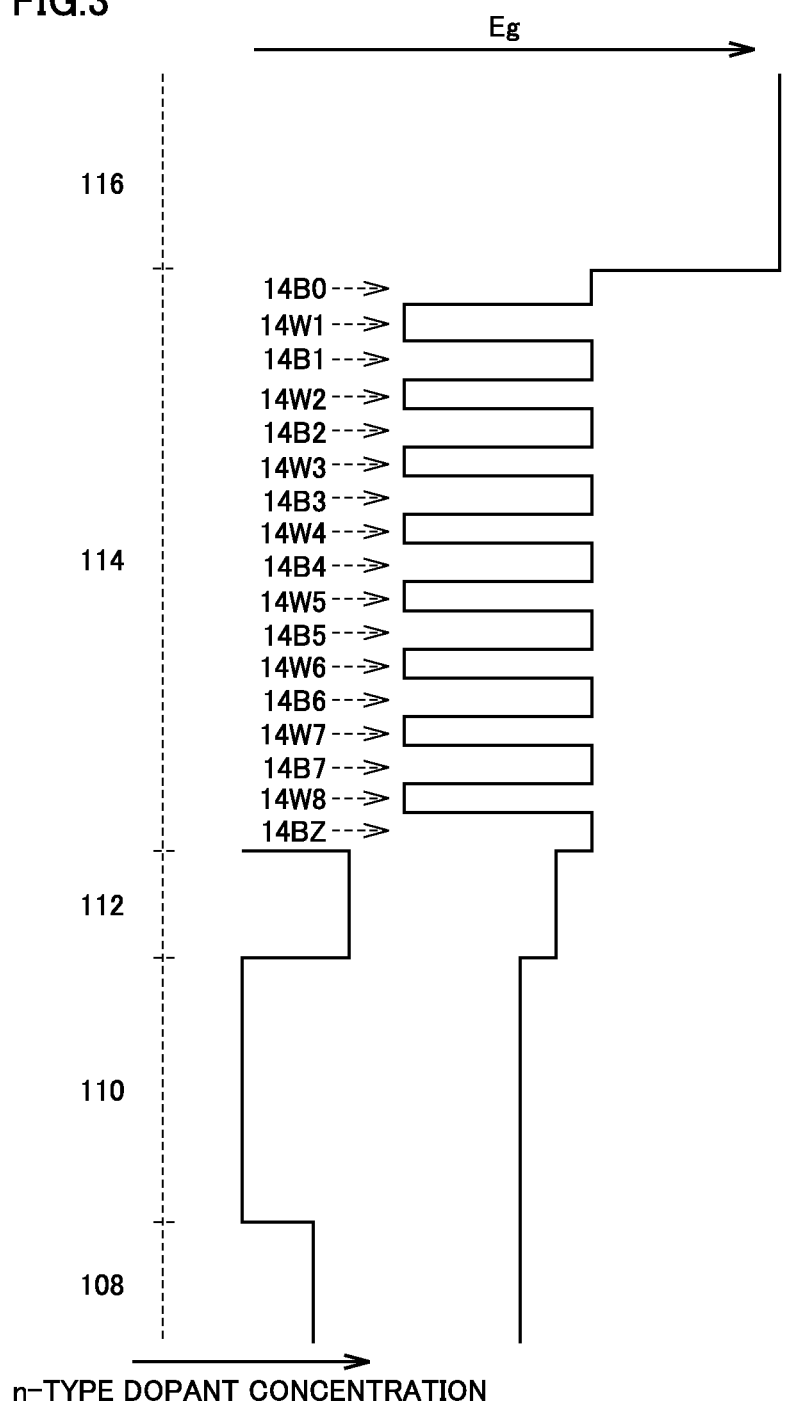
FIG. 3 is a diagram showing an exemplary relation between a band gap energy and an n-type dopant concentration of each of a first n-type nitride semiconductor layer, a second n-type nitride semiconductor layer, an n-type electron-injection layer, a light-emitting layer and a p-type nitride semiconductor layer of the nitride semiconductor light-emitting element according to an embodiment.

FIG. 3 is a diagram showing an exemplary relation between a band gap energy and an n-type dopant concentration of each of first n-type nitride semiconductor layer 108, second n-type nitride semiconductor layer 110, n-type electron-injection layer 112, light-emitting layer 114 and p-type nitride semiconductor layer 116 of the nitride semiconductor light-emitting element according to the embodiment. The vertical axis in FIG. 3 denotes the thickness in the lamination direction, where the upward direction means that the layer is close to p-type nitride semiconductor layer 116. The horizontal axis in FIG. 3 denotes the magnitude of the band gap energy and the n-type dopant concentration, where the line on the right side of FIG. 3 represents the magnitude of the band gap energy, the line on the left side of FIG. 3 represents the magnitude of the n-type dopant concentration, and the rightward direction to the horizontal axis in FIG. 3 means that the band gap energy is large and the n-type dopant concentration is high.

As shown in FIG. 3, light-emitting layer 114 includes quantum well layers 14W (14W1 to 14W8) and barrier layers 14B (14B0, 14B1 to 14B7, 14BZ). Quantum well layers 14W and barrier layers 14B (14B0, 14B1 to 14B7, 14BZ) are stacked alternately. Each quantum well layer 14W is sandwiched between barrier layers 14B (14B0, 14B1 to 14B7, 14BZ), and each barrier layer 14B (14B1 to 14B5) is sandwiched between quantum well layers 14W (14W1 to 14W8).

A first barrier layer 14BZ is provided immediately above n-type electron-injection layer 112. A last barrier layer 14B0 is provided immediately above a first quantum well layer 14W1 located closest to p-type nitride semiconductor layer 116.

Note that in the description, for identifying each barrier layer and each quantum well layer, each layer is given with a respective number increasing in the direction from p-type nitride semiconductor layer 116 toward n-type electron-injection layer 112, and denoted as for example quantum well layer 14W1, barrier layer 14B1, quantum well layer 14W2, barrier layer 14B2 and so on.

A single semiconductor layer or multiple semiconductor layers different from barrier layers 14B (14B0, 14B1 to 14B7, 14BZ) and quantum well layers 14W may be provided between one of barrier layers 14B (14B0,14B1 to 14B7, 14BZ) and one quantum well layer 14W. In addition, the pedioric length (the sum of the thickness of each of quantum well layers 14W and the thickness of each of barrier layers 14B (14B0, 14B1 to 14B7, 14BZ)) of light-emitting layer 114 may be set to, for example, 5 nm or more and 100 nm or less.

Each quantum well layer 14W may be, for example, an independent nitride semiconductor layer represented by the formula of $Al_{c1}Ga_{d1}In_{(1-c1-d1)}N$ ($0 \leq c1 \leq 1$, $0 \leq d1 \leq 1$), and preferably each quantum well layer 14W may be a layer made of $In_{e1}Ga_{(1-e)}N$ ($0 \leq e1 \leq 1$) without containing Al. It is possible to change the composition of In each quantum well layer 14W so as to adjust the band gap energy of quantum well layer 14W. For example, if light-emitting layer 114 is made to emit ultraviolet light having a wavelength of 375 nm or less, it is necessary to increase the band gap energy of light-emitting layer 114, and thereby, each quantum well layer 14W should include Al.

Among multiple quantum well layers 14W, some of quantum well layers 14W, for example, located closer to the side of substrate 101 may include an n-type dopant. As a result, the drive voltage of the nitride semiconductor light-emitting element is prone to decrease.

The thickness of each quantum well layer 14W is not particularly limited, but is preferable to be identical to each other. In the case where the thickness of each quantum well layer 14W is identical to each other, since the quantum level of each quantum well layer 14W is also identical, the light generated in each quantum well layer 14W by recombination of electrons and holes in each quantum well layer 14W will be identical. Thereby, the emission spectral width of the nitride semiconductor light-emitting element is preferably narrowed. On the other hand, in the case of intentionally differentiating the composition and/or the thickness of each quantum well layer 14W, the emission spectrum width of the nitride semiconductor light-emitting element may be made broad.

The thickness of each quantum well layer 14W is preferably 1 nm or more and 7 nm or less. Confining the thickness of each quantum well layer 14W in the range of 1 nm or more and 7 nm or less makes it possible to improve the luminous efficiency of the nitride semiconductor light-emitting element when driven at a large current density.

Each barrier layer 14B (14B0, 14B1 to 14B7, 14BZ) may be made of, for example, a nitride semiconductor material having a band gap energy greater than that of the nitride semiconductor material constituting each quantum well layer 14W, preferably an independent nitride semiconductor layer represented by the formula of $Al_fGa_gIn_{(1-f-g)}N$ ($0 \leq f < 1$, $0 < g \leq 1$), more preferably a nitride semiconductor layer represented by the formula of $Al_hGa_{(1-h)}N$ ($0 < h \leq 1$) containing Al, and further preferably a nitride semiconductor layer represented by the formula of $Al_hGa_{(1-h)}N$ ($0 < h < 1$) containing both Ga and Al.

The thickness of each barrier layer 14B (14B1 to 14B7) is not particularly limited, but is preferably 1 nm or more and 10 nm or less and more preferably 3 nm or more and 7 nm or less. The operating voltage is reduced as the thickness of each barrier layer 14B (14B1 to 14B7) is made thinner, but in the case where the thickness of each barrier layer 14B (14B1 to 14B7) is made extremely thin, the luminous efficiency of the semiconductor light-emitting element operating at a large current density is prone to decrease. The thickness of first barrier layer 14BZ is not particularly limited, but is preferably 1 nm or more and 10 nm or less. The thickness of last barrier layer 14B0 is not particularly limited, but is preferably 1 nm or more and 40 nm or less.

Though barrier layers 14B (14B1 to 14B7) and first barrier layer 14BZ are configured as undoped, the n-type dopant concentration is not particularly limited and may be appropriately adjusted where necessary. In addition, among multiple barrier layers 14B (14B1 to 14B7), it is preferable that barrier layers 14B (14B1 to 14B7) located closer to the side of substrate 101 is doped with n-type dopant and the other barrier layers 14B (14B1 to 14B7) located closer to the side of p-type nitride semiconductor layer 116 is doped with n-type dopant at a lower concentration than barrier layers 14B (14B1 to 14B7) located closer to the side of substrate 101 or is not doped with n-type dopant.

In addition, each barrier layer 14B (14B1 to 14B7), first barrier layer 14BZ and last barrier layer 14B0 may be doped with p-type dopant due to the thermal diffusion during the growth of p-type nitride semiconductor layer 116 and p-type nitride semiconductor layer 118.

The layer number of quantum well layers 14W is not particularly limited, but preferably is 1 layer or more and 20 layers or less, more preferably is 3 layers or more and 15 layers or less, and further preferably is 4 layers or more and 12 layers or less.

P-type nitride semiconductor layer 116 or 118 is preferably an independent layer of, for example, $Al_{x4}Ga_{y4}In_{z4}N$ ($0 \leq x4 \leq 1$, $0 \leq y4 \leq 1$, $0 \leq z4 \leq 1$, $x4+y4+z4 \neq 0$) doped with p-type dopant, and in particular, p-type nitride semiconductor layer 116 is preferably a layer of $Al_{x4}Ga_{(1-x4)}N$ ($0 < x4 \leq 0.4$, and preferably $0.1 \leq x4 \leq 0.3$) doped with p-type dopant, and p-type nitride semiconductor layer 118 is preferably a layer having a smaller band gap than p-type nitride semiconductor layer 116.

The p-type dopant is not limited but preferably is magnesium, for example. The carrier concentration in p-type nitride semiconductor layer 116 or 118 is preferably $1 \times 10^{17}/cm^3$ or more. Since the activation rate of p-type dopant is about 0.01, the p-type dopant concentration (different from the carrier concentration) in p-type nitride semiconductor layer 116 or 118 is preferably $1 \times 10^{19}/cm^3$ or more.

The total thickness of p-type nitride semiconductor layers 116, 118 is not particularly limited but is preferably 50 nm or more and 300 nm or less. Reducing the thickness of the total thickness of p-type nitride semiconductor layers 116, 118 makes it possible to shorten the heating time during the growth of p-type nitride semiconductor layers 116, 118, and thereby, it is possible to suppress the diffusion of p-type dopant in p-type nitride semiconductor layers 116, 118 to light-emitting layer 114.

Note that p-type electron-injection layer 116 also functions as a p-type cladding layer sandwiching light-emitting layer 114.

Each of transparent electrode layer 122, p electrode 124 and n electrodes 126 is an electrode for supplying driving power to the nitride semiconductor light-emitting element. As shown in FIG. 2, though n electrode 126 and p electrode 124 are formed to have only a pad electrode portion, it may be connected with an elongated protrusion (a branch electrode) for the purpose of current spreading, for example.

Transparent electrode layer 122 is preferably a transparent conductive film made of, for example, ITO (Indium Tin Oxide) or IZO (Indium Zinc Oxide), and preferably has a thickness of 20 nm or more and 200 nm or less.

It is preferable that p electrode 124 and n electrode 126 are formed by laminating a nickel layer, an aluminum layer, a titanium layer and a gold layer in order, but they may not necessarily have the same structure and either one of them may have a different structure. Since wire bonding is supposed to be performed on p electrode 124 and n electrode 126, each thickness of p electrode 124 and n electrode 126 is preferably 1 µm or more.

It is preferable to provide an insulating layer below p electrode 124, preferably below transparent electrode 122 so as to prevent a current from being injected directly beneath p electrode 124. Thus, the light emission amount shielded by p electrode 124 is reduced, and thereby, the light extraction efficiency is improved.

Transparent insulation protection film 128 may be a film made of, for example, $SiO_2$ but not limited thereto.

The carrier concentration refers to the concentration of electrons or holes, and is determined not merely by the amount of n-type dopant or the amount of p-type dopant. The carrier concentration is calculated on the basis of the result of voltage-capacity characteristics of the nitride semiconductor light-emitting element, and refers to a carrier concentration in the state where no current is injected, which is the sum of carriers generated from ionized impurities, crystal donor defects and crystal acceptor defects.

However, since the activation rate of the n-type dopant such as Si or the like is high, it can be considered that the n-type carrier concentration is substantially equal to the n-type dopant concentration. Further, the n-type dopant concentration can be easily determined by measuring the concentration distribution in the depth direction by SIMS (Secondary Ion Mass Spectroscopy). Furthermore, the relative relationship (ratio) of the dopant concentration is substantially equal to the relative relationship of the carrier concentration (ratio). From these facts, in the present invention, the carrier concentration is defined as the dopant concentration which can be easily obtained in actual measurement. By averaging the n-type dopant concentrations obtained by the measurement in the thickness direction, it is possible to obtain the average n-type dopant concentration.

In the nitride semiconductor light-emitting element of the present invention, the average n-type dopant concentration of second n-type nitride semiconductor layer 110 is set to 0.53 times or less as high as the average n-type dopant concentration of first n-type nitride semiconductor layer 108, and the average n-type dopant concentration of n-type electron-injection layer 112 is set to 1.5 times or more as high as the average n-type dopant concentration of second n-type nitride semiconductor layer 110. This is based on the findings by the inventors of the present invention after intensive investigations that if the carrier concentration of n-type electron-injection layer 112 closest to light-emitting layer 114 is set high, it is possible to improve the luminous efficiency of the nitride semiconductor light-emitting element even when the operating current density is high, and by providing the second n-type nitride semiconductor layer having a low carrier concentration below n-type electron-injection layer 112, it is possible to suppress the deterioration of electrostatic breakdown voltage.

In the nitride semiconductor light-emitting element of the present invention, it is preferable that n-type electron-injection layer 112 has a larger band gap than second n-type nitride semiconductor layer 110. Thereby, since electrons or holes can be better confined in light-emitting layer 114, it is possible to further improve the luminous efficiency of the nitride semiconductor light-emitting element even in the case where the operating current density is high.

In the nitride semiconductor light-emitting element of the present invention, it is preferable that light-emitting layer 114 includes a quantum well layer and a barrier layer, and is made of a nitride semiconductor containing Ga and Al. Thereby, since electrons or holes can be better confined in light-emitting layer 114, it is possible to further improve the luminous efficiency of the nitride semiconductor light-emitting element even if the operating current density is high.

In the nitride semiconductor light-emitting element of the present invention, it is preferable that the thickness of n-type electron-injection layer 112 is 10 nm or more and 100 nm or less. Thereby, since the electrons can be better injected into light-emitting layer 114, it is possible to reduce the operating voltage while suppressing the deterioration of electrostatic withstand voltage, and since electrons or holes can be better confined in light-emitting layer 114, it is possible to further improve the luminous efficiency of the nitride semiconductor light-emitting element even if the operating current density is high. Furthermore, it is preferable that the emission peak wavelength (which is a wavelength corresponding to the peak in the emission spectrum) of the nitride semiconductor light-emitting element of the present invention is 250 nm or more and 445 nm or less. The present invention works very effectively for a nitride semiconductor light-emitting element that emits shortwave light having an emission peak wavelength of 250 nm or more and 445 nm or less.

Furthermore, it is preferable that the emission peak wavelength of the nitride semiconductor light-emitting element of the present invention is 250 nm or more and 445 nm or less. The present invention works very effectively for a nitride semiconductor light-emitting element that emits shortwave light having an emission peak wavelength of 250 nm or more and 445 nm or less.

Hereinafter, a manufacturing method of a nitride semiconductor light-emitting element of Example 1 shown in a schematic sectional view of FIG. 4 will be described.

Figure 4:
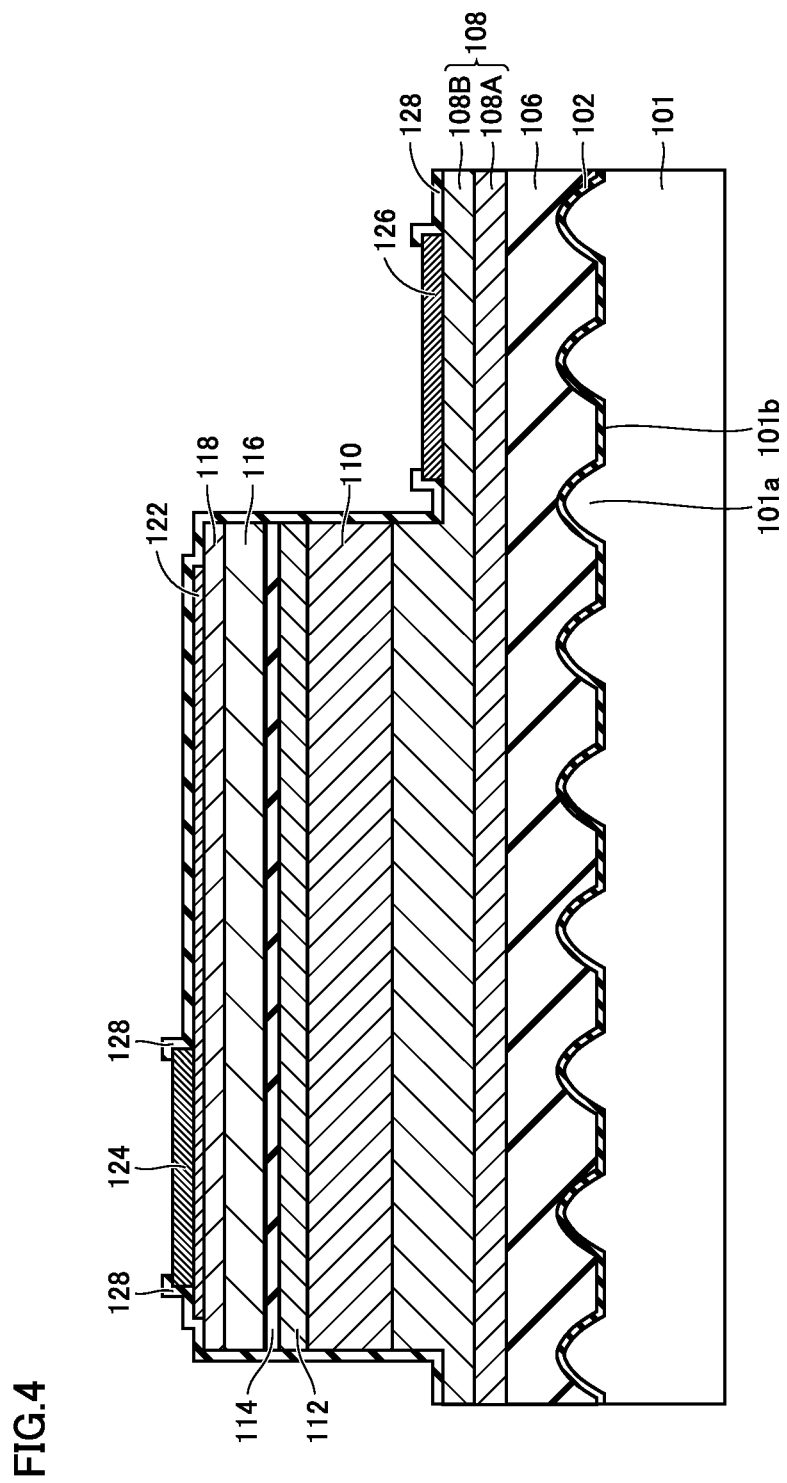
FIG. 4 is a schematic sectional view of a nitride semiconductor light-emitting element according to Example 1.

First, as shown in FIG. 4, a sapphire substrate of 100 mm in diameter was prepared as substrate 101 by machining irregularities composed of convex portions 101a and concave portions 101b on the top surface thereof. Convex portion 101a has a substantially circular shape, and in planar view, three adjacent convex portions 101a are positioned at three vertexes of a substantially equilateral triangle. The distance between the vertexes of adjacent convex portions 101a was 2 µm, the diameter of the substantially circular convex portion 101a in planar view was about 1.2 µm, and the height of convex portion 101a was about 0.6 µm. Furthermore, convex portion 101a and concave portion 101b on the top surface of substrate 101 each has a cross section shown in FIG. 4, and convex portion 101a has a tip end.

Next, the RCA cleaning was performed on the top surface of substrate 101 after the formation of convex portions 101a and concave portions 101b. After the RCA cleaning, substrate 101 was installed in a chamber, while Ar, $N_2$ and $O_2$ were being introduced, substrate 101 was heated to 650° C. so as to form buffer layer 102 of 35 nm in thickness from AlON crystals composed of an aggregate of columnar crystals with uniform crystal grains extending in the direction normal to the surface of substrate 101 by a reactive sputtering method configured to sputter an Al target on the surface of substrate 101 formed with convex portions 101a and concave portions 101b.

Then, first substrate 101 formed with buffer layer 102 was housed in a first MOCVD apparatus. Then, nitride semiconductor base layer 106 was grown from undoped GaN on buffer layer 102 and subsequently a first n-type nitride semiconductor layer 108A was grown from Si-doped n-type GaN by the MOCVD method. Here, the thickness of nitride semiconductor base layer 106 was controlled at 3.8 µm, the thickness of first n-type nitride semiconductor layer 108A was controlled at 3 µm, and the n-type dopant concentration in first n-type nitride semiconductor layer 108A was controlled at $1 \times 10^{19}/cm^3$.

Increasing the thickness of nitride semiconductor base layer 106 as much as possible may help to reduce the defects in nitride semiconductor base layer 106, but the defect reduction effect in nitride semiconductor base layer 106 would saturate after the thickness of nitride semiconductor base layer 106 reaches a certain thickness. It was found that the thickness of nitride semiconductor base layer 106 is preferably 1 μm or more and 8 μm or less, and more preferably 3 μm or more and 5 μm or less.

Next, substrate 101 was removed from the first MOCVD apparatus and housed in a second MOCVD apparatus. The temperature of substrate 101 was set to 1250° C. to grow a first n-type nitride semiconductor layer 108B (n-type dopant concentration: $1 \times 10^{19}/cm^3$) from n-type GaN to have a thickness of 1.5 μm. Thereby, first n-type nitride semiconductor layer 108 which is a laminate of two layers consisting of first n-type nitride semiconductor layer 108A and n-type nitride semiconductor layer 108B (average n-type dopant concentration: $1 \times 10^{19}/cm^3$) was obtained.

Then, while substrate 101 was being kept at a temperature of 940° C., second n-type nitride semiconductor layer 110 (average n-type dopant concentration: $1 \times 10^{18}/cm^3$) was grown from Si-doped n-type GaN to have a thickness of 360 nm.

Thereafter, n-type electron-injection layer 112 (average n-type dopant concentration: $1.5 \times 10^{19}/cm^3$) was grown from Si-doped n-type $Al_{0.03}Ga_{0.97}N$ to have a thickness of 20 nm.

Then, the temperature of substrate 101 was lowered to 840° C. so as to grow light-emitting layer 114. Specifically, as shown in FIG. 3, each barrier layer 14B (14BZ, 14B1 to 14B7, 14B0) made of undoped $Al_{0.05}Ga_{0.95}N$ and each quantum well layer 14W (14W1 to 14W8) made of undoped $In_{0.11}Ga_{0.89}N$ were grown layer by layer alternately. The thickness of barrier layer 14BZ and the thickness of each of barrier layers 14B1 to 14B7 were controlled at 4.3 nm, the thickness of each quantum well layer (14W1 to 14W8) was controlled at 2.9 nm, and the thickness of barrier layer 14B0 was set controlled at 8 nm.

Subsequently, the temperature of substrate 101 was raised to 1200° C. so as to grow on the top surface of last barrier layer 14B0 a p-type $Al_{0.2}Ga_{0.8}N$ layer and a p-type GaN layer serving as p-type nitride semiconductor layers 116 and 118, respectively. In order to achieve an ultimate p-type dopant concentration, the flow rate of the p-type dopant material was not kept constant but varied where appropriate.

In the growth of each layer described above by the MOCVD method, TMG (trimethyl gallium) was used as a source gas for providing Ga, TMA (trimethyl aluminum) was used as a source gas for providing Al, TMI (trimethyl indium) was used as a source gas for providing In, and $NH_3$ was used as a source gas for providing N. $SiH_4$ was used as a source gas for providing Si which serves as an n-type dopant, and $Cp_2Mg$ was used as a source gas for providing Mg which serves as a p-type dopant. However, the source gas is not limited to any of the abovementioned gases, any gas as long as it can be used as a source gas suitable for MOCVD may be used without limitation. Specifically, TEG (triethyl gallium) may be used as a source gas for providing Ga, TEA (triethyl aluminum) may be used as a source gas for providing Al, TEI (triethyl indium) may be used as a source gas for providing In, an organic nitrogen compound such as DMHy (dimethyl hydrazine) may be used as a source gas for providing N, and $Si_2H_6$, an organic Si or the like may be used as a source gas for providing Si.

Next, in order to expose a part of the surface of first n-type nitride semiconductor layer 108B, p-type nitride semiconductor layer 118, p-type nitride semiconductor layer 116, light-emitting layer 114, n-type electron-injection layer 112, second n-type nitride semiconductor layer 110, and first n-type nitride semiconductor layer 108B was etched partially. On the top surface of the part of first n-type nitride semiconductor layer 108B which was exposed by the etching, n electrode 126 made of Au was formed. Also, on the top surface of p-type nitride semiconductor layer 118, transparent electrode layer 122 made of ITO and p electrode 124 made of Au was formed sequentially. In addition, transparent insulation protection film 128 made of $SiO_2$ was formed so as to cover mainly transparent electrode layer 122 and the side faces of each layer exposed by the etching.

Then, substrate 101 was divided into chips each sized at 440×530 μm, each chip was mounted to a surface-mount package, p electrode 124 and n electrode 126 were connected to an electrode to the side of the package via a wire bonding method, and thereby, the chip was resin sealed. Thus, the nitride semiconductor light-emitting element of Example 1 was obtained. The emission peak wavelength of the nitride semiconductor light-emitting element of Example 1 was about 405 nm, and at an operating current of 50 mA (approximately 42 mA/cm²), an available light output (emission intensity) was 72.5 mW.

In order to examine the effect of the nitride semiconductor light-emitting element of Example 1, a nitride semiconductor light-emitting element of Comparative Example was produced in the same manner as Example 1 except that n-type electron-injection layer 112 was not formed.

After the nitride semiconductor light-emitting element of Example 1 and nitride semiconductor light-emitting element of Comparative Example were made to work at a high current density of 120 mA/cm², respectively, it was observed that the luminous efficiency of the nitride semiconductor light-emitting element of Example 1, as compared to the luminous efficiency of the nitride semiconductor light-emitting element of Comparative Example, can be improved by several percentages to 10%.

Moreover, in the case where the composition ratio x3 of Al in the composition formula $Al_{x3}Ga_{y3}N$ of n-type electron-injection layer 112 in the nitride semiconductor light-emitting element of Example 1 was varied in the range of 0 to 0.09 (x3=0, 0.01, 0.03, 0.05, 0.07, 0.09) and where the average n-type dopant concentration of n-type electron-injection layer 112 was varied in the range of $7 \times 10^{18}/cm^3$ to $3 \times 10^{19}/cm^3$ ($7 \times 10^{18}/cm^3$, $1 \times 10^{19}/cm^3$, $1.5 \times 10^{19}/cm^3$, $2.2 \times 10^{19}/cm^3$, $3 \times 10^{19}/cm^3$), the improvement results of the luminous efficiency were obtained similar to that described in the above, and especially in the case where the composition ratio x3 of Al was set from 0.01 or more and 0.05 or less, a better improvement of the luminous efficiency was observed.

Figure 5:
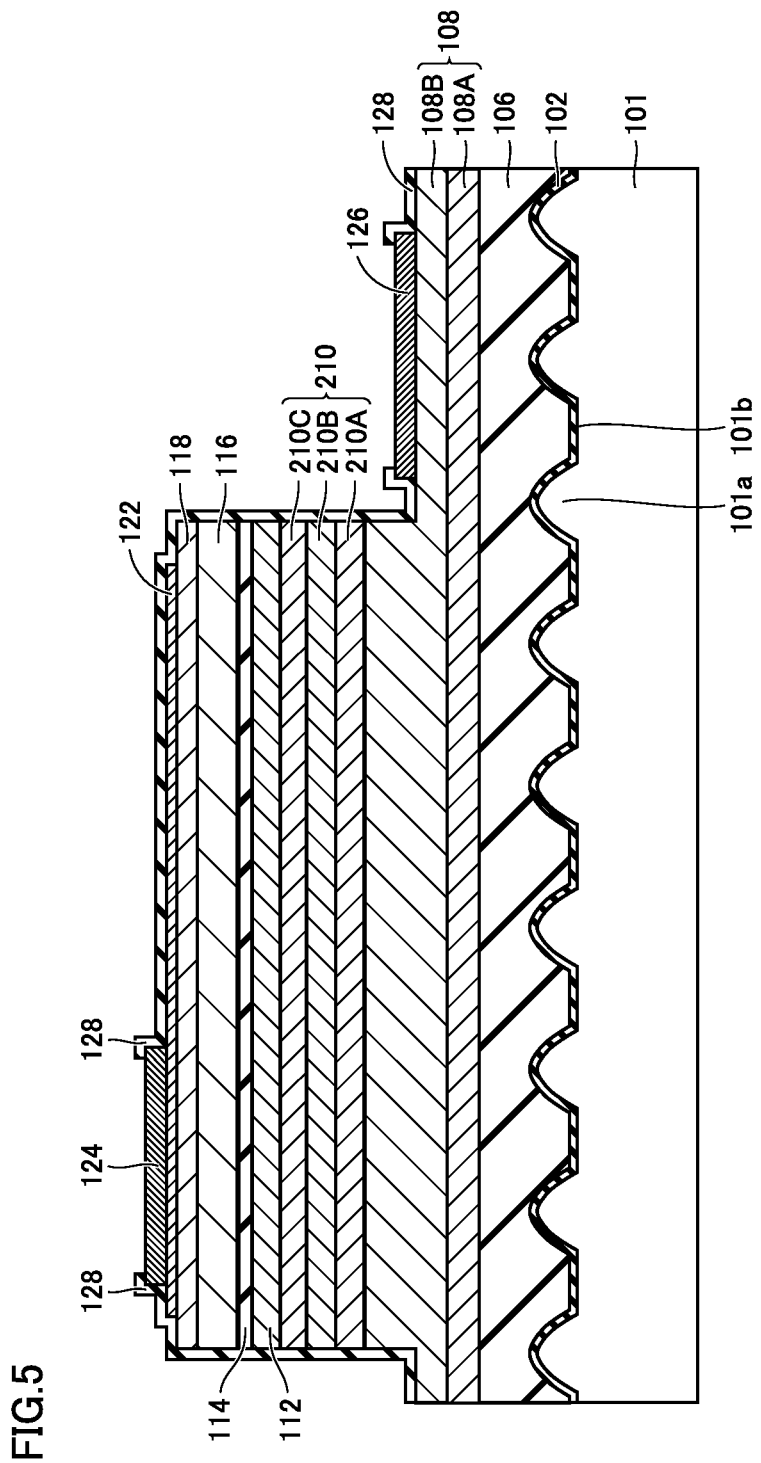
FIG. 5 is a schematic sectional view of a nitride semiconductor light-emitting element according to Example 2.

Hereinafter, a manufacturing method of a nitride semiconductor light-emitting element of Example 2 shown in a schematic sectional view of FIG. 5 will be described. First, in the same manner as in Example 1, buffer layer 102, nitride semiconductor base layer 106, first n-type nitride semiconductor layer 108A, and n-type nitride semiconductor layer 108B were formed in order on the top surface of substrate 101 after the formation of convex portions 101a and concave portions 101b.

Then, while substrate 101 was being kept at a temperature of 940° C., a second n-type nitride semiconductor layer 210A (n-type dopant concentration: $6 \times 10^{18}/cm^3$) was grown from Si-doped n-type GaN to have a thickness of 295 nm, a second n-type nitride semiconductor layer 210B (n-type dopant concentration: $7 \times 10^{17}/cm^3$) was grown from Si-doped n-type GaN to have a thickness of 50 nm, and a second n-type nitride semiconductor layer 210C (n-type dopant concentration: $6 \times 10^{18}/cm^3$) was grown from Si-doped n-type GaN to have a thickness of 15 nm by the MOCVD method in sequence, and thereby, a three-layer laminate composed of second n-type nitride semiconductor layers 210A, 210B and 210C was obtained, achieving a second n-type nitride semiconductor layer 210. The average n-type dopant concentration of second n-type nitride semiconductor layer 210 was $5.26 \times 10^{18}/\text{cm}^3$ ($\approx (6 \times 10^{18} \times (295+15) + 7 \times 10^{17} \times 50)/(295+50+15)$).

Thereafter, the nitride semiconductor light-emitting element of Example 2 was produced in the same manner as in Example 1 except that n-type electron-injection layer 112 (average n-type dopant concentration: $1.5 \times 10^{19}/\text{cm}^3$) was formed by controlling the composition ratio x3 of Al in the composition formula $Al_{x3}Ga_{y3}N$ at 0.02. The emission peak wavelength of the nitride semiconductor light-emitting element of Example 2 was 405 nm.

After the nitride semiconductor light-emitting element of Example 2 was made to work at a high current density of 120 mA/cm², it was observed that the luminous efficiency of the nitride semiconductor light-emitting element of Example 2, as compared to the luminous efficiency of the nitride semiconductor light-emitting element of Comparative Example, can be improved by several percentages to 10%.

In addition, in the nitride semiconductor light-emitting element of Example 2, since second n-type nitride semiconductor layer 210 is formed from a laminate of three layers composed of second n-type nitride semiconductor layer 210A doped with n-type dopant of a medium concentration, second n-type nitride semiconductor layer 210B doped with n-type dopant of a low concentration and second n-type nitride semiconductor layer 210C doped with n-type dopant of a medium concentration, it was observed that the operating voltage can be further reduced without deteriorating the electrostatic withstand voltage of the nitride semiconductor light-emitting element.

In addition, in the case where the thickness of n-type electron-injection layer 112 in the nitride semiconductor light-emitting element of Example 2 was varied from 5 to 100 nm (5 nm, 10 nm, 20 nm, 50 nm and 100 nm), the results similar to the above were obtained, and especially in the case where the thickness of n-type electron-injection layer 112 was controlled at 10 nm or more and 100 nm or less, a better improvement of the luminous efficiency was observed.

Figure 6:
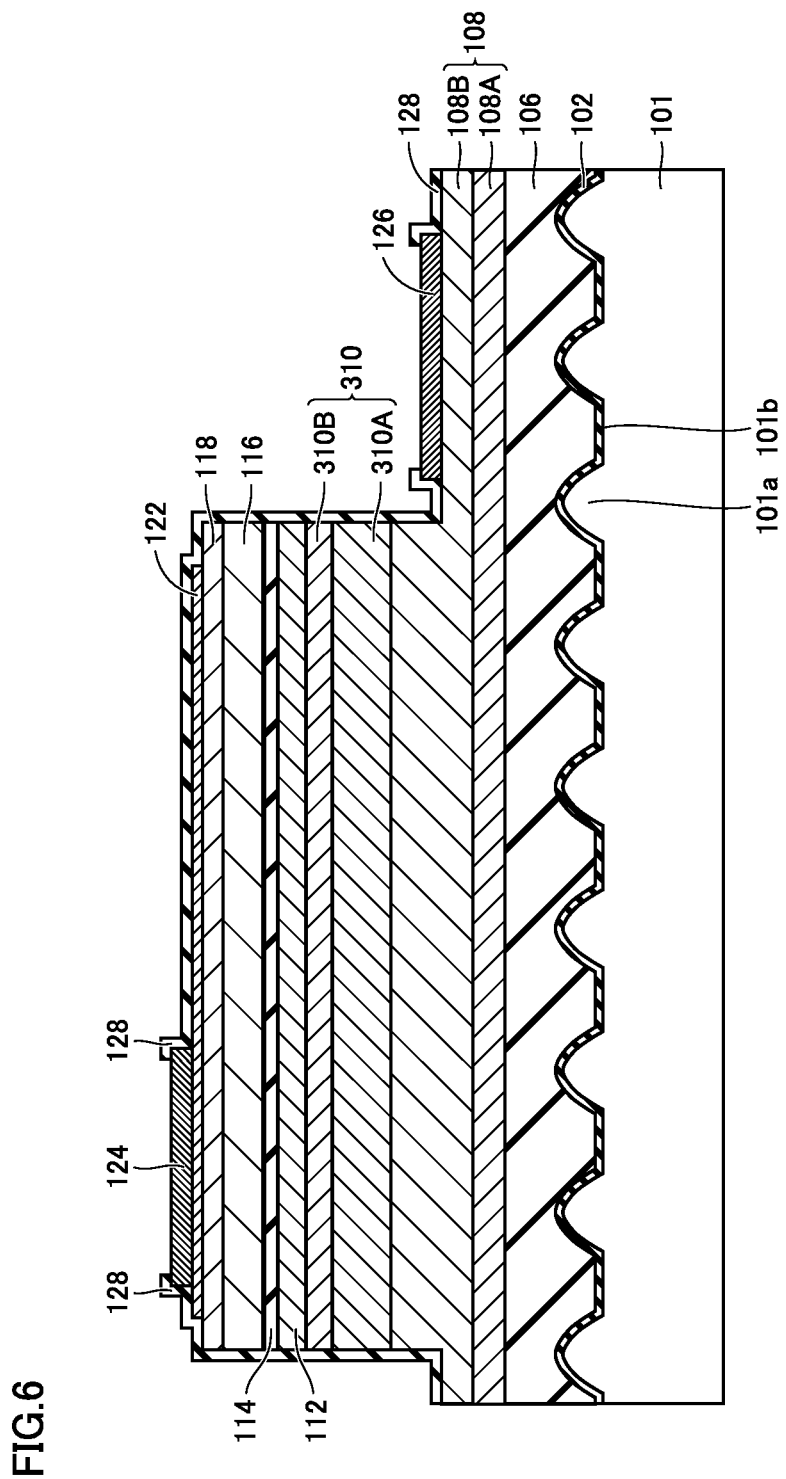
FIG. 6 is a schematic sectional view of a nitride semiconductor light-emitting element according to Example 3.

Hereinafter, a manufacturing method of a nitride semiconductor light-emitting element of Example 3 shown in a schematic sectional view of FIG. 6 will be described. First, in the same manner as in Example 1, buffer layer 102, nitride semiconductor base layer 106, first n-type nitride semiconductor layer 108A, and first n-type nitride semiconductor layer 108B were formed in order on the top surface of substrate 101 after the formation of convex portions 101a and concave portions 101b.

Then, while substrate 101 was being kept at a temperature of 940° C., a second n-type nitride semiconductor layer 310A (n-type dopant concentration: $7 \times 10^{17}/\text{cm}^3$) was grown from Si-doped n-type GaN by the MOCVD method to have a thickness of 64 nm, and thereafter, a second n-type nitride semiconductor layer 310B having a super-lattice structure was grown by the MOCVD method into an laminate composed alternately of an undoped $In_{0.04}Ga_{0.96}N$ layer of 2 nm in thickness and an undoped GaN layer of 2 nm in thickness, and thereby, a two-layer laminate of second n-type nitride semiconductor layers 310A and 310B was obtained, achieving a second n-type nitride semiconductor layer 310. The average n-type dopant concentration of second n-type nitride semiconductor layer 310 was $6.59 \times 10^{17}/\text{cm}^3$ ($\approx (7 \times 10^{17} \times 64)/(64+2+2)$).

Thereafter, the nitride semiconductor light-emitting element of Example 3 was produced in the same manner as in Example 1 except that n-type electron-injection layer 112 (average n-type dopant concentration: $1.5 \times 10^{19}/\text{cm}^3$) was formed by controlling the composition ratio x3 of Al in the composition formula $Al_{x3}Ga_{y3}N$ at 0.03 and quantum well layer 14W (14W1 to 14W8) was formed from undoped $In_{0.18}Ga_{0.82}N$. The emission peak wavelength of the nitride semiconductor light-emitting element of Example 3 was 445 nm.

After the nitride semiconductor light-emitting element of Example 3 was made to work at a high current density of 120 mA/cm², it was observed that the luminous efficiency of the nitride semiconductor light-emitting element of Example 3, as compared to the luminous efficiency of the nitride semiconductor light-emitting element of Comparative Example, can be improved by about 2% to 5%. It is believed that this is due to that second n-type nitride semiconductor layer 310 having a super-lattice structure was able to relax the crystal defects in the nitride semiconductor layer grown on second n-type nitride semiconductor layer 310.

Further in Example 3, in the nitride semiconductor light-emitting element having an emission peak wavelength of about 450 nm and specifically of 445 nm, the layer immediately below n-type electron-injection layer 112 was formed as second n-type nitride semiconductor layer 310B having super-lattice structure which is an alternate laminate composed of an undoped $In_{0.04}Ga_{0.96}N$ layer and an undoped GaN layer, such super-lattice structure may be applied to a nitride semiconductor light-emitting element having a shorter wavelength emission peak wavelength of 405 nm or 385 nm.

Figure 7:
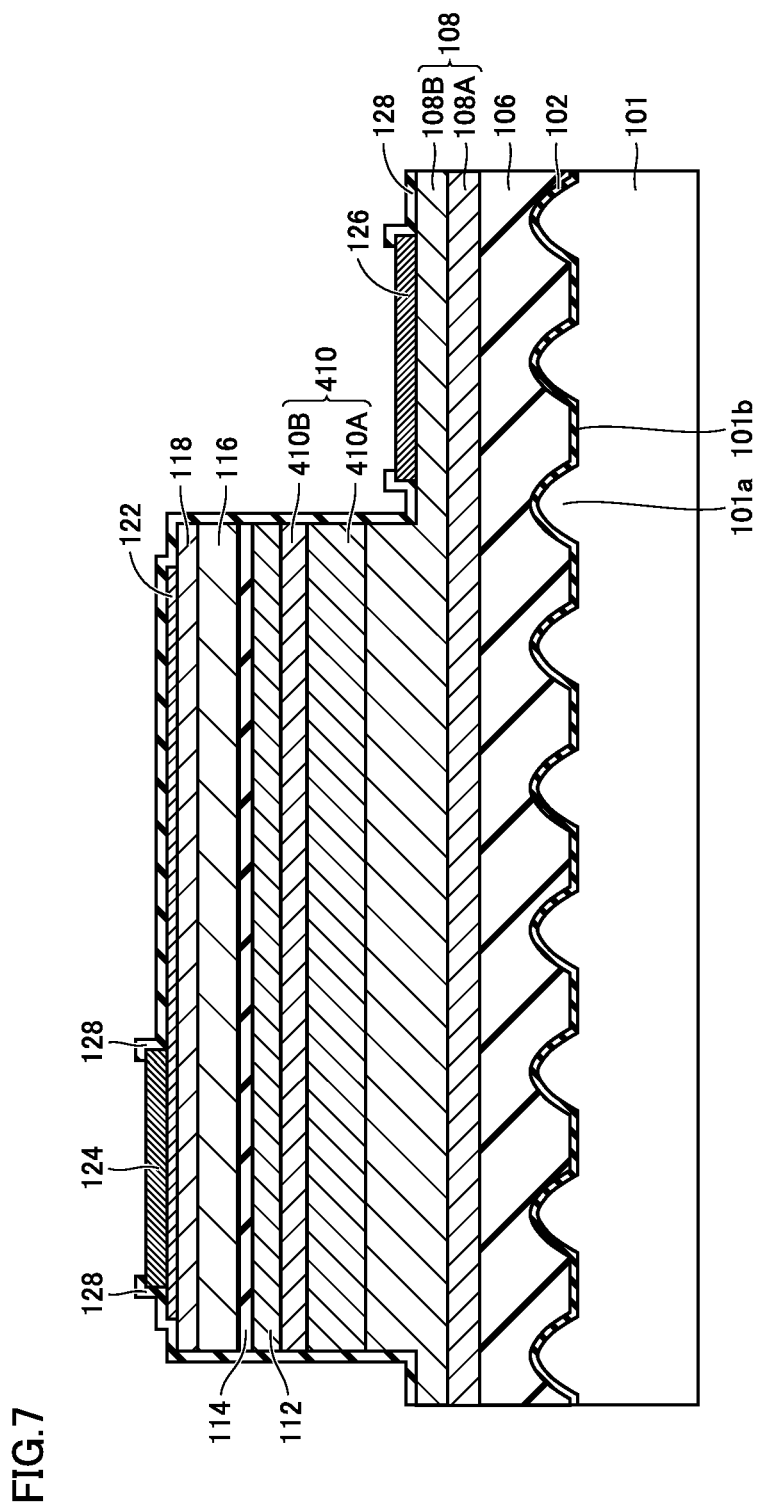
FIG. 7 is a schematic sectional view of a nitride semiconductor light-emitting element according to Example 4.

Hereinafter, a manufacturing method of a nitride semiconductor light-emitting element of Example 4 shown in a schematic sectional view of FIG. 7 will be described. First, in the same manner as in Example 1, buffer layer 102, nitride semiconductor base layer 106, first n-type nitride semiconductor layer 108A, and n-type nitride semiconductor layer 108B were formed in order on the top surface of substrate 101 after the formation of convex portions 101a and concave portions 101b.

Then, while substrate 101 was being kept at a temperature of 940° C., a second n-type nitride semiconductor layer 410A (n-type dopant concentration: $7 \times 10^{17}/\text{cm}^3$) was grown from Si-doped n-type GaN by the MOCVD method to have a thickness of 280 nm, and thereafter, a second n-type nitride semiconductor layer 410B having a super-lattice structure was grown by the MOCVD method into an alternate laminate composed of an undoped $Al_{0.02}Ga_{0.98}N$ layer of 2 nm in thickness and an undoped GaN layer of 2 nm in thickness, and thereby, a two-layer laminated of second n-type nitride semiconductor layers 410A and 410B was obtained, achieving a second n-type nitride semiconductor layer 410. The average n-type dopant concentration of second n-type nitride semiconductor layer 410 was $6.90 \times 10^{17}/\text{cm}^3$ ($\approx (7 \times 10^{17} \times 280)/(280+2+2)$).

Thereafter, the nitride semiconductor light-emitting element of Example 4 was produced in the same manner as in Example 1 except that n-type electron-injection layer 112 (average n-type dopant concentration: $1.5 \times 10^{19}/\text{cm}^3$) was formed by controlling the composition ratio x3 of Al in the composition formula $Al_{x3}Ga_{y3}N$ at 0.07, each barrier layer 14B (14BZ, 14B1 to 14B7, 14B0) was formed from undoped AlGaInN, and each quantum well layer 14W (14W1 to 14W8) was formed from undoped $In_{0.06}Ga_{0.94}N$. The emission peak wavelength of the nitride semiconductor light-emitting element of Example 4 was 385 nm, and the light output thereof was 50 mA.

Accordingly, even in the case where the emission peak wavelength is a short wavelength of 385 nm, the good current injection and the prevention of the overflow of holes can be achieved by current injection layer 112 having a high carrier concentration, and since second n-type nitride semiconductor layer 410B does not include InGaN, the amount of light absorbed by second n-type nitride semiconductor layer 410B can be reduced, and thereby, an improved luminous efficiency can be observed.

Additionally, in order to shorten the emission peak wavelength, it is preferable that each barrier layer 14B (14BZ, 14B1 to 14B7, 14B0) in light-emitting layer 114 is made of AlGaN, and additionally, if each barrier layer 14B is made of quaternary mixed crystals of AlGaInN added with In, it is possible to reduce the influence of crystal defects due to the composition fluctuation of In. Also, for quantum well layers 14W (14W1 to 14W8), In is mixed in the GaN layer in order to reduce the crystal defects; however, mixing In in the GaN layer will shift the emission peak wavelength to a longer wavelength. If Al is further added, it is possible to adjust the wavelength while reducing the influence of crystal defects.

Hereinafter, a manufacturing method of a nitride semiconductor light-emitting element of Example 5 shown in a schematic sectional view of FIG. 8 will be described.

Figure 8:
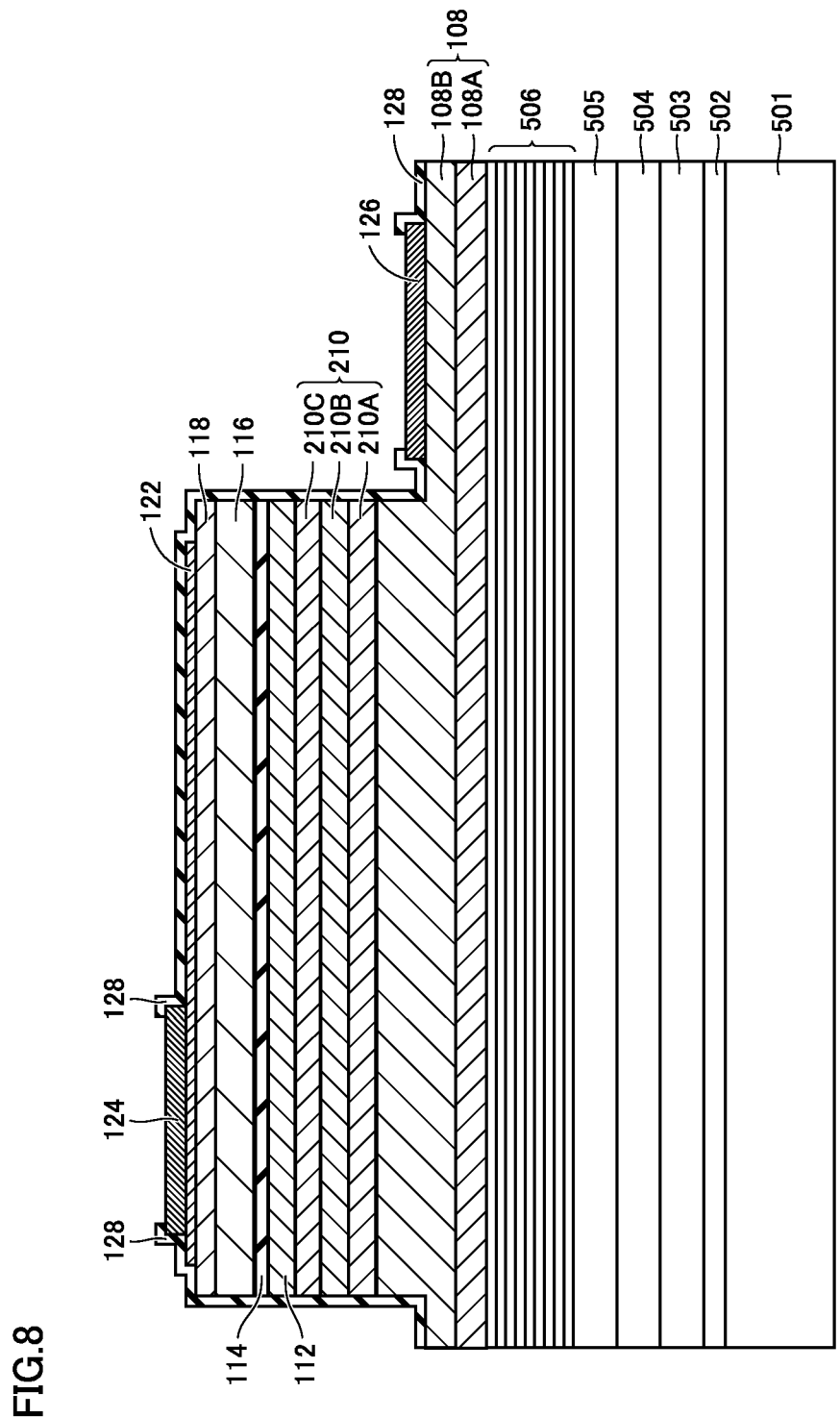
FIG. 8 is a schematic sectional view of a nitride semiconductor light-emitting element according to Example 5.

First, as shown in FIG. 8, a Si substrate 501 of 4 inches in diameter was used as the substrate. Prior to the crystal growth of the nitride semiconductor layer, the surface oxide film of Si substrate 501 was removed in a hydrofluoric acid-based etchant, and thereafter, Si substrate 501 was set in a chamber of the MOCVD apparatus.

Then, Si substrate 501 in the MOCVD apparatus was heated to 1100° C., and a surface ((111) plane) of Si substrate 501 was cleaned under a hydrogen atmosphere at a chamber pressure of 13.3 kPa.

Then, while Si substrate 501 was being kept at the temperature and the chamber pressure, $NH_3$ (12.5 slm) was introduced into the chamber to nitrify the surface of Si substrate 501. Subsequently, TMA at a flow rate of 117 μmol/min and $NH_3$ at a flow rate 12.5 slm was introduced into the chamber to grow an undoped AN layer 502 having a thickness of 200 nm by the MOCVD method on the surface of Si substrate 501.

Thereafter, the temperature of Si substrate 501 was raised to 1150° C., TMG at a flow rate of 57 TMA at a flow rate of 97 μmol/min, and $NH_3$ at a flow rate of 12.5 slm were introduced into the chamber to grow an undoped $Al_{0.7}Ga_{0.3}N$ layer 503 having a thickness of 400 nm by the MOCVD method on the surface of AlN layer 502.

Next, TMG at a flow rate of 99 μmol/min, TMA at a flow rate of 55 μmol/min, and $NH_3$ at a flow rate of 12.5 slm were introduced into the chamber to grow an undoped $Al_{0.4}Ga_{0.6}N$ layer 504 having a thickness of 400 nm by the MOCVD method on the surface of $Al_{0.7}Ga_{0.3}N$ layer 503.

Next, TMG at a flow rate of 137 μmol/min, TMA at a flow rate of 18 μmol/min, and $NH_3$ at a flow rate of 12.5 slm were introduced into the chamber to grow an undoped $Al_{0.1}Ga_{0.9}N$ layer 505 having a thickness of 400 nm by the MOCVD method on the surface of $Al_{0.4}Ga_{0.6}N$ layer 504.

Subsequently, while Si substrate 501 was being kept at the same temperature, a multi-layered buffer layer structure 506 was formed on the surface of $Al_{0.1}Ga_{0.9}N$ layer 505 by alternately laminating for 50 cycles an AlN layer having a thickness of 5 nm and an $Al_{0.4}Ga_{0.9}N$ layer having a thickness of 20 nm by the MOCVD method. At this time, the AlN layer was grown by introducing into the chamber TMA at a flow rate of 102 μmol/min and $NH_3$ at a flow rate of 12.5 slm, and the $Al_{0.1}Ga_{0.9}N$ layer was grown by introducing into the chamber TMG at a flow rate of 137 μmol/min, TMA at a flow rate of 80 μmol/min, and $NH_3$ at a flow rate of 12.5 slm.

Thereafter, the nitride semiconductor light-emitting element of Example 5 was produced in the same manner as in Example 2 except that n-type electron-injection layer 112 (average n-type dopant concentration: $1.5 \times 10^{19}/cm^3$) was formed by controlling the composition ratio x3 of Al in the composition formula $Al_{x3}Ga_{y3}N$ at 0.04. The emission peak wavelength of the nitride semiconductor light-emitting element of Example 5 was 405 nm.

After the nitride semiconductor light-emitting element of Example 5 was made to work at a high current density of 120 $mA/cm^2$, it was observed that though the luminous efficiency of the nitride semiconductor light-emitting element of Example 5 is lower than the luminous efficiency of each nitride semiconductor light-emitting element of Examples 1 to 4 due to the light absorption of Si substrate 501, it is still improved in comparison to the luminous efficiency of the nitride semiconductor light-emitting element of Comparative Example. It is expected that the luminous efficiency of the nitride semiconductor light-emitting element of Example 5 can be further improved by removing Si substrate 501.

Regarding why good results were obtained in the novel structure described herein, the inventors of the present application considered that the reasons may include the following ones.

1. Hall block effect: for example, in the nitride semiconductor light-emitting element having a short emission peak wavelength (of about 420 nm or less, such as the nitride semiconductor light-emitting element of Examples 1, 2 and 5 having an emission peak wavelength of 405 nm), as the band gap of the quantum well layer becomes greater than the wavelength (about 450 nm) of blue light, it is easy for the holes to move to the side of the n-type nitride semiconductor layer of the light-emitting layer, but at the same time, the n-type electron-injection layer of a high dopant concentration functions as a hole blocking layer to prevent the holes from leaking to the side of the n-type nitride semiconductor layer, and thereby, the luminous efficiency of the nitride semiconductor light-emitting element is improved. The same fact also leads to improve the characteristics of the nitride semiconductor light-emitting element at a high temperature of 80° C. or more.

2. Electron-injection effect: as the n-type electron-injection layer adjacent to the light-emitting layer, an n-type nitride semiconductor layer having a high average n-type dopant concentration than the second n-type nitride semiconductor layer is provided immediately below the n-type electron-injection layer, which facilitates the injection of electrons into the light-emitting layer. Such effect will become more remarkable when the n-type electron-injection layer has a greater band gap. Thereby, it is possible to reduce the operating voltage. In addition, the "two-dimensional electron layer effect", in other words, along with the bending of the band when there is a band gap difference between the n-type electron-injection layer and the second n-type nitride semiconductor layer, a two-dimensional electron layer is formed, and such two-dimensional electron layer effect may promote the expansion of electrons in the horizontal direction, contributing to the effect of reducing the operating voltage.

3. Electrostatic withstand voltage improvement effect: the inventors of the present invention believe that (i) by reducing the n-type carrier concentration of the second n-type nitride semiconductor layer lower than the carrier concentration of the n-type electron-injection layer and by making the n-type electron-injection layer as thin as for example 20 nm, the barrier for the electrons between the n-type electron-injection layer and the second n-type nitride semiconductor layer will become smaller, and (ii) at the time of applying a voltage to the nitride semiconductor light-emitting element so as to make it emit light, the depletion layer will pass over the thin n-type electron-injection layer and spread in the second n-type nitride semiconductor layer having a low average n-type dopant concentration, and thereby, the voltage gradient is reduced, leading to the increasing of the electrostatic breakdown voltage.

The reasons described above are merely inferred reasons, the effects of the present invention may be obtained from the other reasons.

The present invention provides a nitride semiconductor light-emitting element which includes in order a first n-type nitride semiconductor layer, a second n-type nitride semiconductor layer, an n-type electron-injection layer, a light-emitting layer, and a p-type nitride semiconductor layer, wherein the average n-type dopant concentration of the second n-type nitride semiconductor layer is 0.53 times or less as high as the average n-type dopant concentration of the first n-type nitride semiconductor layer, and the average n-type dopant concentration of the n-type electron-injection layer is 1.5 times or more as high as the average n-type dopant concentration of the second n-type nitride semiconductor layer. According to the configuration described above, it is possible to improve the luminous efficiency of the nitride semiconductor light-emitting element even in the case where the operating current density is high.

In the nitride semiconductor light-emitting element of the present invention, it is preferable that the n-type electron-injection layer has a larger band gap than the second n-type nitride semiconductor layer and is made of a nitride semiconductor containing Ga and Al. According to such configuration, since electrons or holes can be better confined in the light-emitting layer, it is possible to further improve the luminous efficiency of the nitride semiconductor light-emitting element even if the operating current density is high.

In the nitride semiconductor light-emitting element of the present invention, it is preferable that the light-emitting layer includes a quantum well layer and a barrier layer, and is made of a nitride semiconductor containing Ga and Al. According to such configuration, since electrons or holes can be better confined in the light-emitting layer, it is possible to further improve the luminous efficiency of the nitride semiconductor light-emitting element even if the operating current density is high.

In the nitride semiconductor light-emitting element of the present invention, it is preferable that the thickness of the n-type electron-injection layer is 10 nm or more and 100 nm or less. According to such configuration, since the electrons can be better injected into the light-emitting layer, it is possible to reduce the operating voltage while suppressing the deterioration of electrostatic withstand voltage, and since electrons or holes can be better confined in the light-emitting layer, it is possible to further improve the luminous efficiency of the nitride semiconductor light-emitting element even if the operating current density is high.

Furthermore, it is preferable that the emission peak wavelength of the nitride semiconductor light-emitting element of the present invention is 250 nm or more and 445 nm or less. The present invention works very effectively for a nitride semiconductor light-emitting element that emits shortwave light having an emission peak wavelength of 250 nm or more and 445 nm or less.

The embodiments and examples of the present invention have been described above. However, proper combinations of the constitutions of the respective embodiments and the respective specific examples are also originally intended.

It should be understood that the embodiments and the examples disclosed herein have been presented for the purpose of illustration and description but not limited in all aspects. It is intended that the scope of the present invention is not limited to the description above but defined by the scope of the claims and encompasses all modifications equivalent in meaning and scope to the claims.

The nitride semiconductor light-emitting element of the present invention is applicable to general illuminations, LCD backlights, displays, visible light communications, UV light sources and the like, for example.

REFERENCE SIGNS LIST

14W1, 14W2, 14W3, 14W4, 14W5, 14W6: quantum well layer; 14B0, 14B1, 14B2, 14B3, 14B4, 14B5, 14BZ: barrier layer; 101: substrate; 101a: convex portion; 101b: concave portion; 102: buffer layer; 106: nitride semiconductor base layer; 108, 108A, 108B: first n-type nitride semiconductor layer; 110, 210, 210A, 210B, 210C, 310, 310A, 310B, 410, 410A, 410B: second n-type nitride semiconductor layer; 112: n-type electron-injection layer; 114: light-emitting layer; 116, 118: p-type nitride semiconductor layer; 122: transparent electrode layer; 124: p electrode; 126: n electrode; 128: transparent insulation protection film; 501: Si substrate; 502: AN layer; 503: $Al_{0.7}Ga_{0.3}N$ layer; 504: $Al_{0.4}Ga_{0.6}N$ layer; 505: $Al_{0.1}Ga_{0.9}N$ layer; 506: multi-layered buffer layer structure

The invention claimed is:

1. A nitride semiconductor light-emitting element comprising in order:
    a first n-type nitride semiconductor layer,
    a second n-type nitride semiconductor layer,
    an n-type electron-injection layer, said n-type electron-injection layer having a larger band gap than said second n-type nitride semiconductor layer, said n-type electron-injection layer containing Al,
    a light-emitting layer, and
    a p-type nitride semiconductor layer,
    the average n-type dopant concentration of said second n-type nitride semiconductor layer being equal to or less than 0.53 times the average n-type dopant concentration of said first n-type nitride semiconductor layer, and
    the average n-type dopant concentration of said n-type electron-injection layer being at least 1.5 times the average n-type dopant concentration of said second n-type nitride semiconductor layer.

2. The nitride semiconductor light-emitting element according to claim 1, wherein said light-emitting layer includes a quantum well layer and a barrier layer, and said barrier layer is made of a nitride semiconductor containing Ga and Al.

3. The nitride semiconductor light-emitting element according to claim 1, wherein the thickness of said n-type electron-injection layer is between 10 nm and 100 nm.

4. The nitride semiconductor light-emitting element according to claim 1, wherein an emission peak wavelength of said nitride semiconductor light-emitting element is between 250 nm and 445 nm.

\* \* \* \* \*